United States Patent
Fukuda

(10) Patent No.: US 8,331,146 B2
(45) Date of Patent: Dec. 11, 2012

(54) FLASH MEMORY

(75) Inventor: Koichi Fukuda, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 197 days.

(21) Appl. No.: 12/828,658

(22) Filed: Jul. 1, 2010

(65) Prior Publication Data
US 2011/0002165 A1  Jan. 6, 2011

(30) Foreign Application Priority Data

Jul. 2, 2009 (JP) ................................ 2009-157560

(51) Int. Cl.
*G11C 16/04* (2006.01)
*G11C 7/10* (2006.01)
(52) U.S. Cl. .............................. 365/185.03; 365/185.05
(58) Field of Classification Search .................. None
See application file for complete search history.

(56) References Cited

U.S. PATENT DOCUMENTS

| | | | | |
|---|---|---|---|---|
| 5,930,172 A | * | 7/1999 | Kucera | 365/185.21 |
| 6,331,945 B1 | * | 12/2001 | Shibata et al. | 365/185.03 |
| 6,807,096 B2 | | 10/2004 | Toda | |
| 2005/0030816 A1 | * | 2/2005 | Banks | 365/222 |
| 2010/0110788 A1 | * | 5/2010 | Bauer | 365/185.03 |

FOREIGN PATENT DOCUMENTS

JP  2004-206933  7/2004

* cited by examiner

*Primary Examiner* — Hoai V Ho
*Assistant Examiner* — James G Norman
(74) *Attorney, Agent, or Firm* — Oblon, Spivak, McClelland, Maier & Neustadt, L.L.P.

(57) ABSTRACT

A flash memory according to a present embodiment includes a memory cell array. The memory cell array includes a plurality of memory cells. Each of the memory cells can store n-bit data (n is an integer equal to or larger than 2). A plurality of word line are connected to gate terminals of the memory cells. A plurality of bit lines are connected to the memory cells. Sense amplifiers are configured to detect data stored in the memory cells via the bit lines. A data latch circuit of m×n bits can store n-bit data stored in each of m memory cells (m is an integer equal to or larger than 2) connected to one of the word lines. A multi-level interface can simultaneously transfer data of two or more bits between the data latch circuit and outside.

12 Claims, 18 Drawing Sheets

| OUTPUT1 | 0 | 0 | 0 | 1 |
|---|---|---|---|---|
| OUTPUT2 | 0 | 0 | 1 | 1 |
| OUTPUT3 | 0 | 1 | 1 | 1 |
| UPPER DATA | 1 | 1 | 0 | 0 |
| LOWER DATA | 1 | 0 | 0 | 1 |

FLASH MEMORY

CROSS REFERENCE TO RELATED APPLICATIONS

This application is based upon and claims the benefit of priority from the prior Japanese Patent Application No. 2009-157560, filed on Jul. 2, 2009, the entire contents of which are incorporated herein by reference.

FIELD

Embodiments of the present invention relates to a flash memory.

BACKGROUND

In a NAND flash memory, a multi-level-cell technique or storing data of two or more bits in one cell has been widely used in order to reduce bit costs. Further, to reduce the chip size, down-scaling of memory cells is progressing. Under these circumstances, spreading of a threshold voltage distribution of memory cells due to interferences between adjacent cells, and random noise such as read noise and program noise is significant, and it has become more difficult to form a threshold voltage distribution of memory cells in a small range.

A reading error easily occurs when a distance between adjacent threshold-voltage distributions is small. In this case, an improved error correction technique, that is, an ECC (Error-correcting code) technique, is necessary to prevent a reading error. That is, the ECC technique having a high error-correction rate is necessary for down-scaled memory cells using a multi-level-cell technique. In a NAND flash memory, data writing and data reading are performed in a page unit. Conventionally, a unit of error correction is closed within one page. However, according to a recent improved ECC technique, a reading error is sometimes corrected in a unit extended to multiple pages, in order to increase the error correction rate. For example, in the case of an eight-level-cell technique, that is, when a memory cell stores 3-bit data, a group of data extended to three pages is corrected as one unit. By reading the whole pages corresponding to the number of bits stored in each memory cell, a threshold voltage level to which each memory cell belongs to can be specified. Data in a certain memory cell is erroneously detected as data of an adjacent threshold-voltage level with higher probability. Therefore, an improved ECC correction can be achieved by using information about a threshold voltage distribution to which data belongs to.

However, when the unit of ECC correction is extended to multiple pages, these pages need to be read out individually, and thus it takes a long time to read the data out.

To improve writing performance, a batch writing scheme (a full-sequence writing system) is sometimes used in a multi-value NAND flash memory. A four-level-cell NAND flash memory stores 2-bit information in a memory cell by forming four threshold-voltage distributions. In a conventional writing scheme, four threshold-voltage distributions extended to two pages are formed in 2 steps. That is, two threshold-voltage distributions are formed first in writing a lower page, and then final four threshold-voltage distributions are formed in writing an upper page. In the full-sequence writing scheme, the four threshold-voltage distributions corresponding to two pages are formed at one time in a one-time write operation. In this case, before starting a write operation, 2-bit data to be stored in each memory cell needs to be transferred to writing-data latch circuits in advance. In this case, multiple pages also need to be individually transferred, and thus this data transfer takes a long time.

DETAILED DESCRIPTION

Embodiments will now be explained with reference to the accompanying drawings.

A flash memory according to a present embodiment comprises a memory cell array. The memory cell array includes a plurality of memory cells. Each of the memory cells can store n-bit data (n is an integer equal to or larger than 2). A plurality of word line are connected to gate terminals of the memory cells. A plurality of bit lines are connected to the memory cells. Sense amplifiers are configured to detect data stored in the memory cells via the bit lines. A data latch circuit of m×n bits can store n-bit data stored in each of m memory cells (m is an integer equal to or larger than 2) connected to one of the word lines. A multi-level interface can simultaneously transfer data of two or more bits between the data latch circuit and outside.

First Embodiment

Figure 1:
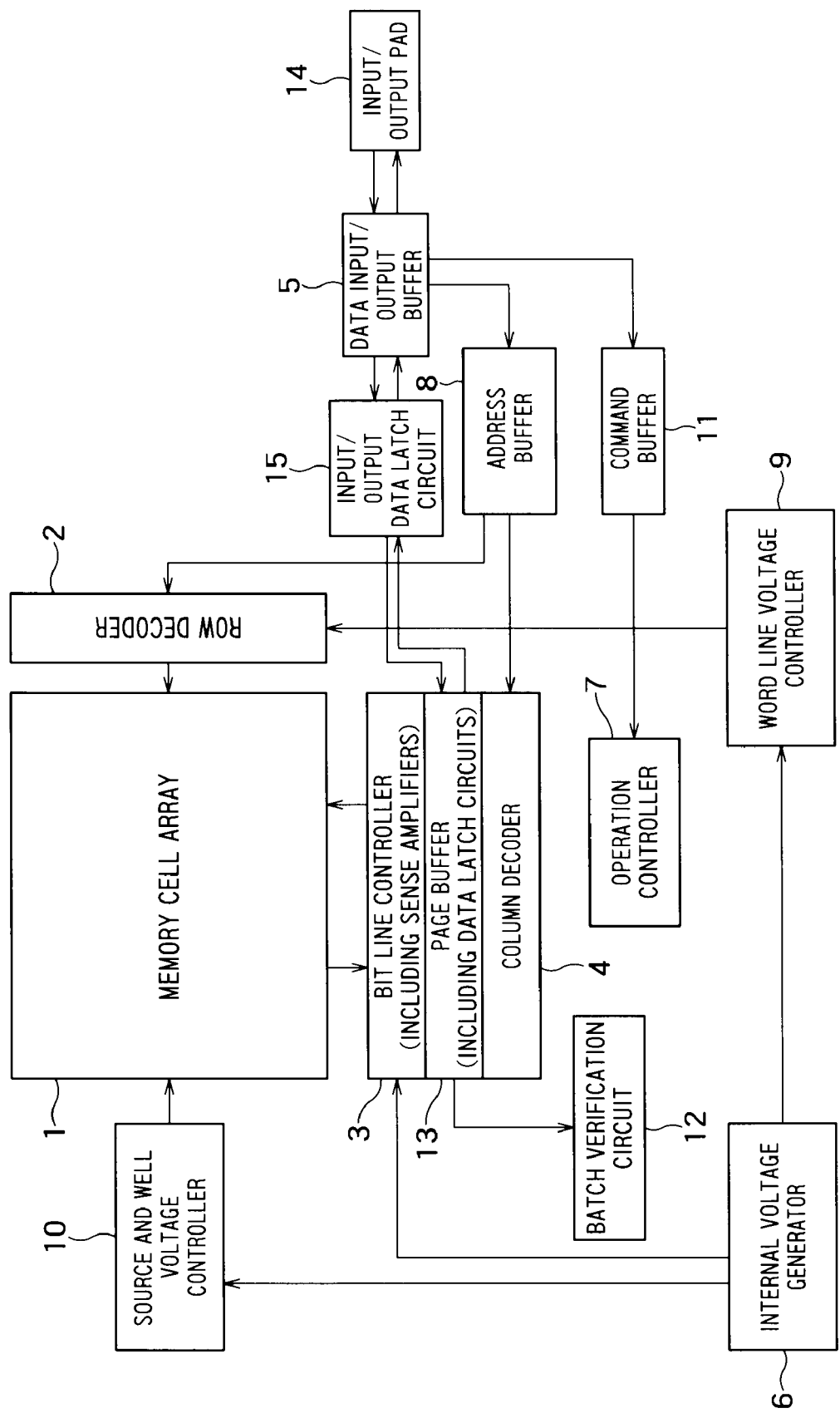
FIG. 1 is a block diagram showing a configuration of relevant parts of a NAND flash memory 100 according to a first embodiment of the present invention.
Figure 2:
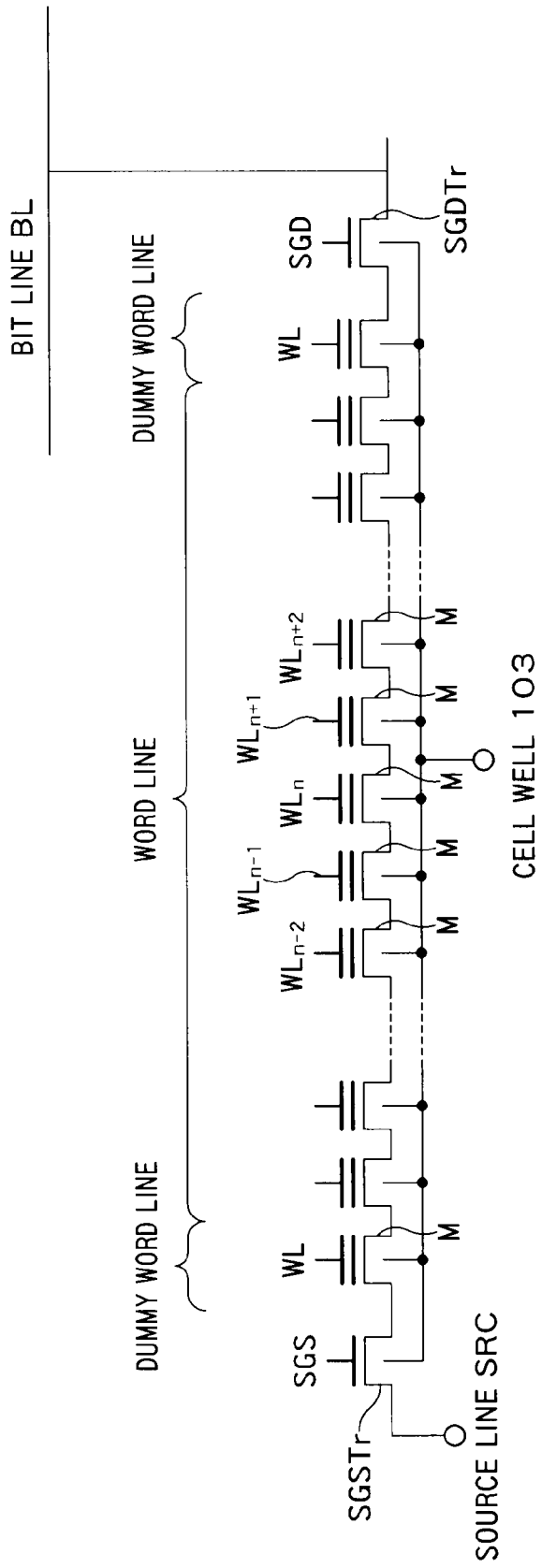
FIG. 2 is a circuit diagram showing a circuit configuration of a NAND string in a column direction within a memory cell array 1 in FIG. 1.

FIG. 1 is a block diagram showing a configuration of relevant parts of a NAND flash memory 100 according to a first embodiment of the present invention. FIG. 2 is a circuit diagram showing a circuit configuration of a NAND string in a column direction within a memory cell array 1 in FIG. 1. The NAND string includes plural memory cells M connected in series, and two selection gates (a source-side selection gate SGS transistor SGSTr, and a drain-side selection gate SGD transistor SGDTr) connected to both ends of the series of the memory cells M. The source-side selection gate SGS transistor SGSTr is connected to a source line SRC, and the drain-side selection gate SGD transistor SGDTr is connected to a bit line BL.

As shown in FIG. 1, the NAND flash memory 100 includes the memory cell array 1, a row decoder 2, a bit-line controller 3, a column decoder 4, a data input/output buffer 5, an internal voltage generator 6, an operation controller 7, an address buffer 8, a word line voltage controller 9, a source and well voltages controller 10, a command buffer 11, a batch verification circuit 12, a page buffer 13, an input/output pad 14, and an input/output data latch circuit 15.

The memory cell array 1 is connected to a word line WL in a row direction and to the bit line BL in a column direction, and has plural NAND strings arranged in a matrix shape.

The row decoder 2 includes a word line driver (not shown), selects a word line of the memory cell array 1 according to an input address, and drives the selected word line.

The bit-line controller 3 includes a circuit controlling a voltage of the bit line BL, and a sense amplifier S/A sensing a voltage of a bit line or a current flowing through a bit line at a verification read operation and at a read operation. The bit-line controller 3 performs a write, a verification reading, and a read operations, by controlling a voltage of the bit line BL. The NAND flash memory normally performs a write operation and a read operation in a page unit of 512 bytes to 8K bytes. That is, the bit-line controller 3 can simultaneously control the bit lines BL corresponding to 512 bytes to 8K bytes within a page. The memory cell M can store n-bit data (n is an integer equal to or larger than 2). That is, the flash memory according to the first embodiment uses the multi-level technique.

The page buffer 13 includes a data latch circuit DL storing reading data or writing data. The data latch circuits DL are m×n-bit latch circuits storing n-bit data stored in each of m (m is an integer equal to or larger than 2) memory cells M connected to a selected word line WL. That is, in a flash memory with the multi-level technique storing n-bit data in each of the memory cells M, the data latch circuit DL can store data of n or more bits.

The column decoder 4 selects the bit-line controller 3 connected to bit lines of the memory cell array 1. Normally, a selection is performed in one byte unit. That is, the column decoder 4 selects the bit-line controller 3 connected to adjacent eight bit lines.

At a data reading time, data read by the bit-line controller 3 is stored in the page buffer 13, and is further output to the input/output pad 14 via the data input/output buffer 5.

The internal voltage generator 6 boosts or steps down a power source voltage, thereby generating voltages to be supplied to the bit-line controller 3, the word line voltage controller 9, and the source and well voltages controller 10.

The word line voltage controller 9 controls a voltage to be applied to a word line WL (a control gate of a memory cell), and supplies this voltage to the row decoder 2.

The source and well voltages controller 10 controls a voltage of a cell well 102 on a semiconductor substrate 101, and controls a voltage of a source line SRC.

An external control signal such as a chip enable signal CE, a write enable signal WE, a read enable signal RE, an address-latch enable signal ALE, a command-latch enable signal CLE, and a command code is input from outside of a chip to the input/output pad 14. The command code is supplied to the command buffer 11 via an input/output controller (not shown). The command buffer 11 decodes this command code, and supplies a decoded result to the operation controller 7 as a command signal.

The operation controller 7 performs sequence controls of data writing, data erasing, and data reading, based on a command signal supplied corresponding to an operation mode.

When the operation controller 7 outputs signals to control various operations including reading, writing, and erasing, the bit-line controller 3, the internal voltage generator 6, the word line voltage controller 9, and the source and well voltages controller 10 so as to perform various operations. When the operation controller 7 outputs signals to control a verification operation, the verification circuit 12 performs a verification operation.

An address of the memory cell M supplied from the input/output controller (not shown) is transferred to the row decoder 2 and the column decoder 4 via the address buffer 8.

The batch verification circuit 12 determines whether threshold voltages of all memory cells M within a page to be written into a predetermined memory cell M or within a block to be erased reaches a verification level (whether data is written or erased), based on data stored in the page buffer 13 in a verification read operation. The batch verification circuit 12 outputs a determined result to the operation controller 7. The operation controller 7 controls the bit line controller 3, the internal voltage generator 6, the word line voltage controller 9, and the source and well voltages controller 10, based on a verified result, and continues a write operation or an erase operation until when threshold voltages of all of the memory cells M within a page to be written or within a block to be erased reach a verification level (pass-level).

The batch verification circuit 12 can have a function to count the number of the memory cells M not reaching a verification level, or a function to count the number of bit lines or the number of columns connected to the memory cell M not reaching a verification level. In this case, when a count value of the number of the memory cells M not reaching a verification level within a page to be written or within a block to be erased is permissible or within the permissible range set in advance, a write operation or an erase operation can be stopped at the point in time.

A state that all bits or columns reach a verification level is called a pass, and a state that the number of bits or the number of columns not reaching a verification level is within a permissible number of bits or within a permissible number of bytes is called a pseudo-pass.

In the NAND flash memory, a few to dozens of defective bits generated due to various disturbances or defective dataholding characteristics are sometimes corrected by using the ECC technique. However, when there are a sufficient number of correctable bits, it is no problem to stop a write operation or an erase operation in the pseudo-pass state and to leave a small part of the memory cells M in a state not reaching a verification level. With this arrangement, retry of a write operation or an erase operation due to the memory cell M of which writing or erasing is slow can be avoided. As a result, the writing speed or erasing performance can be improved.

Figure 3:
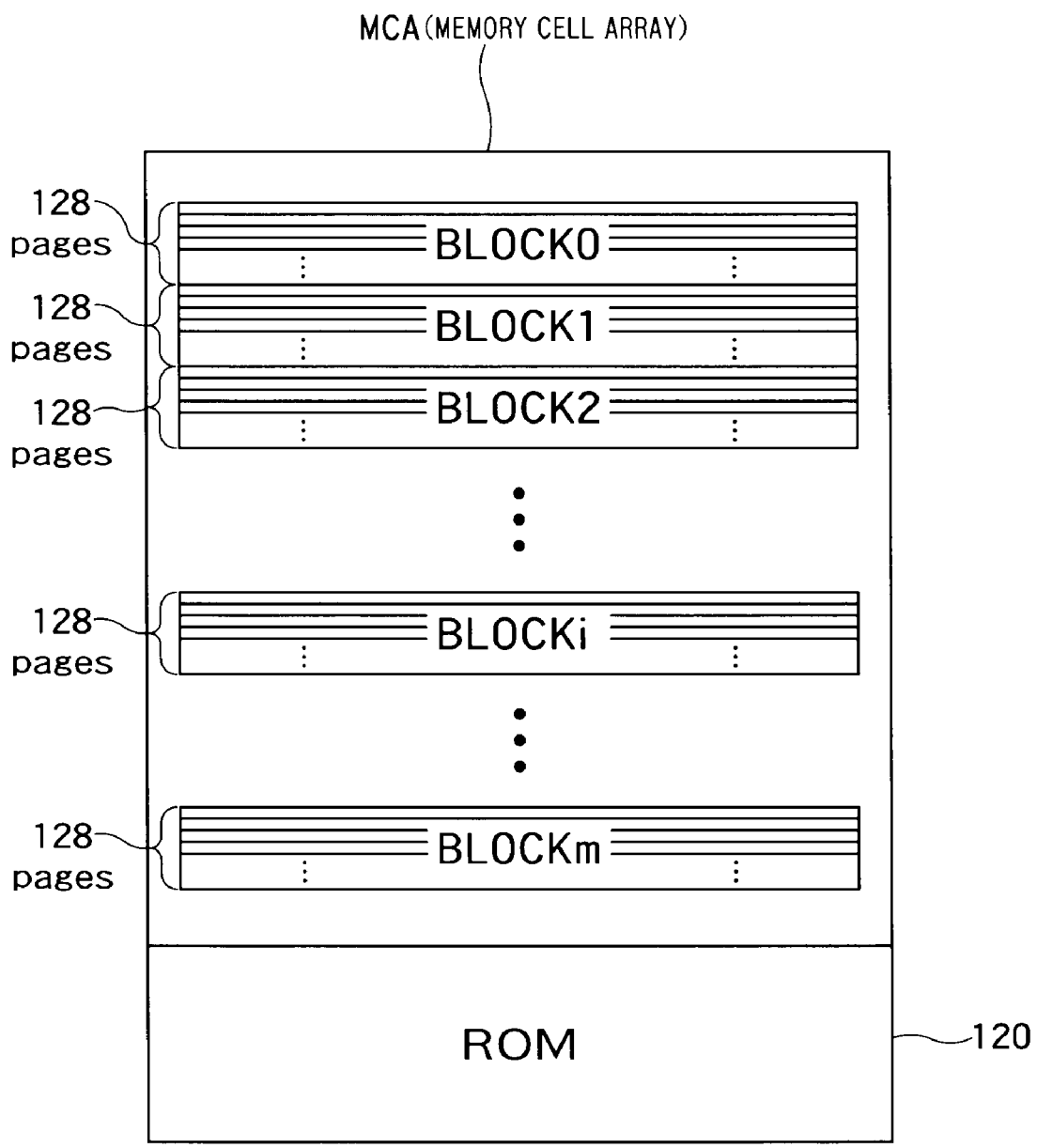
FIG. 3 shows a concept of a block and a page of a memory cell array MCA.

FIG. 3 shows a concept of a block and a page of a memory cell array MCA. The memory cell array MCA is divided into memory cell blocks (hereinafter, also "block") BLOCK0 to BLOCKm. In this example, each of the blocks BLOCK0 to BLOCKm is a minimum unit of data erasing. Each of the blocks BLOCK0 to BLOCKm is configured with multiple pages. A page is a unit of data reading or data writing. Each page corresponds to a word line, and is configured with data of plural memory cells specified by a certain row address. A ROM 120 stores setting information such as a writing voltage necessary for an operation, which is set at a die sort test time.

Figure 4:
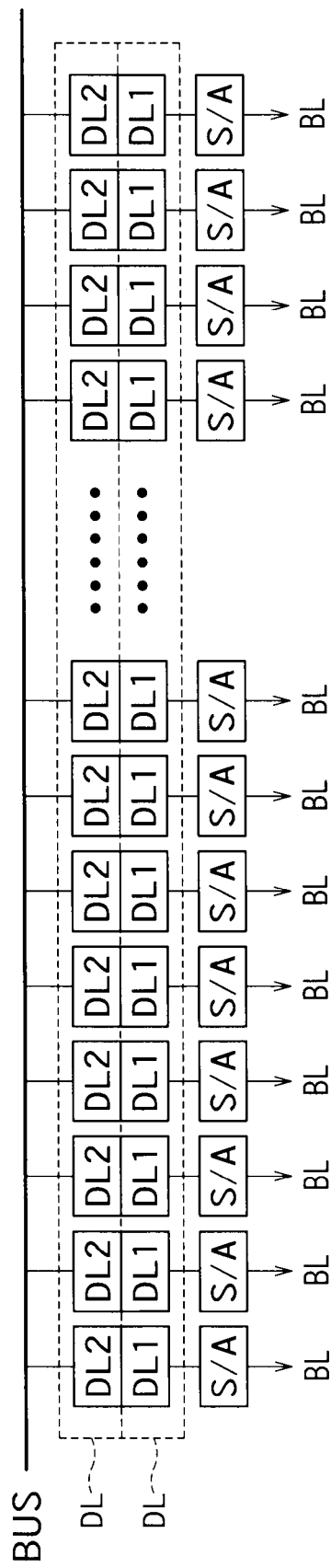
FIG. 4 is a block diagram showing a layout of the data latch circuits DL and the sense amplifiers S/A.
Figure 5:
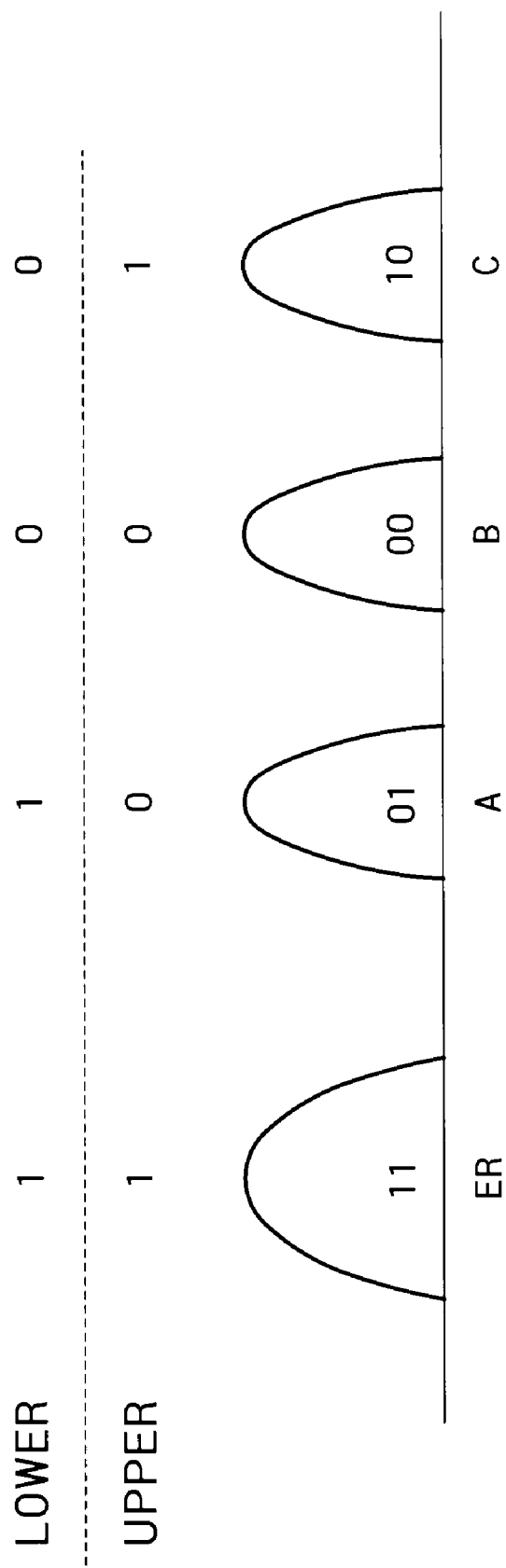
FIG. 5 shows bit assignments of LOWER and UPPER page data in 4-level threshold voltage distributions.

FIG. 4 is a block diagram showing a layout of the data latch circuits DL and the sense amplifiers S/A. Each sense amplifier S/A is connected to the bit line BL. The data latch circuits DL is configured to be able to store data of plural bits corresponding to one bit line or one sense amplifier S/A. When the memory cell M stores n-bit data, it suffices that the data latch circuits DL is configured to be able to store n-bit data for each one bit line or for each one sense amplifier S/A. For example, when the memory cell M stores 2-bit data as shown in FIG. 5, latch circuits DL1 and DL2 are provided for one bit line. Each of the latch circuits DL1 and DL2 can store 1-bit data. Explanations of the first embodiment are continued by assuming n=2, that is, one memory cell M stores 2-bit data.

A set of the latch circuits DL1 and DL2 is provided for each bit line of one page. When m bit lines are included in one page, m sets of the latch circuits DL1 and DL2 are provided. With this arrangement, the data latch circuits DL can simultaneously latch data of two pages including a LOWER page and an UPPER page shown in FIG. 5.

The data latch circuits DL is connected to the data input/output buffer 5 via a data bus BUS.

Figure 6:
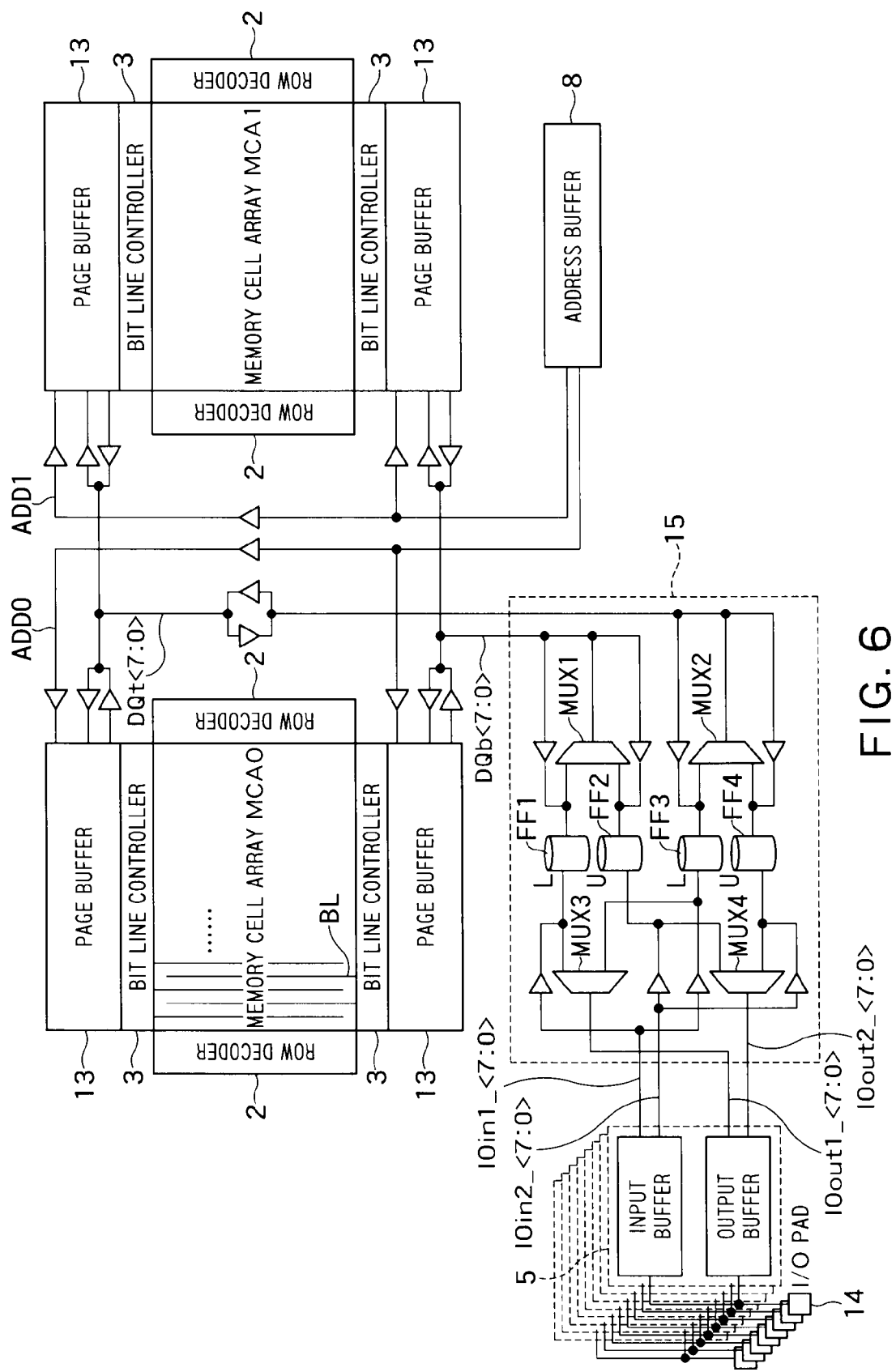
FIG. 6 shows a configuration of the input/output data latch circuit 15, and a configuration of data transfer paths up to a page buffer.

FIG. 6 shows a configuration of the input/output data latch circuit 15, and a configuration of data transfer paths up to a page buffer. The input/output data latch circuit 15 is connected between the page buffer 13 and the data input/output buffer 5, and transfers data between the page buffer 13 and the input/output buffer 5. In this case, 8-bit data <7:0> is batch processed.

Figure 11:
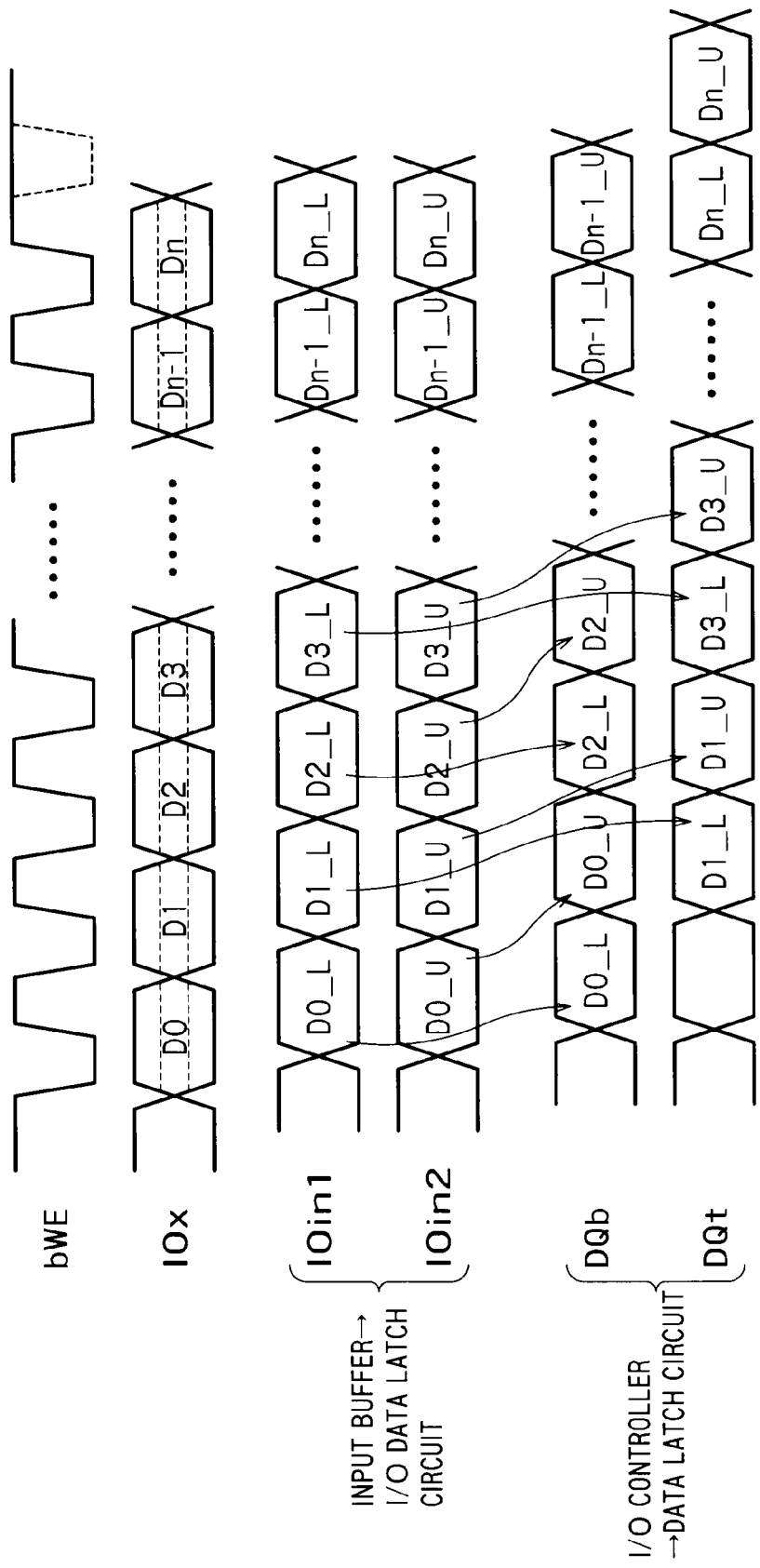
FIG. 11 is a timing diagram showing timings of data transfer from the input/output pad to internal data buses at a data writing time.

The input/output data latch circuit 15 includes flip-flops FF1 to FF4, and multiplexers MUX1 to MUX4. Each of the flip-flops FF1 to FF4 latches 8-bit data, and keeps latching the data until when the next data is transferred. The flip-flops FF1 to FF4 are configured such that when the next data is transferred, the flip-flops FF1 to FF4 are updated by the transferred data, and latch the transferred data. In the first embodiment, data of the LOWER page and data of the UPPER page are simultaneously input as shown in FIG. 11. The flip-flops FF1 and FF3 latch data of the LOWER page, and the flip-flops FF2 and FF4 latch data of the UPPER page. The multiplexers MUX1 and MUX2 are used to transfer input data from the data input/output buffer 5 to the page buffer 13. The multiplexers MUX3 and MUX4 are used to transfer output data from the page buffer 13 to the data input/output buffer 5.

The flip-flop FF1 is connected between one input of the multiplexer MUX1 and one input of the multiplexer MUX3. The flip-flop FF2 is connected between one input of the multiplexer MUX4 and the other input of the multiplexer MUX1. The flip-flop FF3 is connected between the other input of the multiplexer MUX3 and one input of the multiplexer MUX2. The flip-flop FF4 is connected between the other input of the multiplexer MUX4 and the other input of the multiplexer MUX2.

An output of the multiplexer MUX1 is connected to the page buffer 13 at one side (a bottom side) of each of the memory cell arrays MCA0 and MCA1 via a data line DQb. An output of the multiplexer MUX2 is connected to the page buffer 13 at the other side (a top side) of each of the memory cell arrays MCA0 and MCA1 via a data line DQt. Outputs of the multiplexers MUX3 and MUX4 are connected to an output buffer via IO output lines IOout1 and IOout2.

An output of an input buffer is connected to the flip-flops FF1 to FF4 to be able to transfer data thereto via IO input lines IOin1 and IOin2. An output of the page buffer 13 is connected to the flip-flops FF1 to FF4 to be able to transfer data thereto via the data lines DQb and DQt.

At a data writing time, writing data input from outside is first latched by the flip-flops FF1 to FF4, and transferred to the data latch circuits DL shown in FIG. 4 via the multiplexers MUX1 and MUX2. The data latch circuits DL can latch both the LOWER page and the UPPER page. Therefore, data of multiple pages can be continuously transferred to the page buffer 13. The data latched by the data latch circuit DL is written into a selected memory cell M via a bit line.

At a data reading time, data read from the selected memory cell M via a bit line is first latched by the data latch circuits DL, and is transferred to the flip-flops FF1 to FF4 and latched. The latched data is transferred to the output buffer via the multiplexers MUX3 and MUX4. The output buffer outputs the data to outside via the input/output pad 14.

Figure 7:
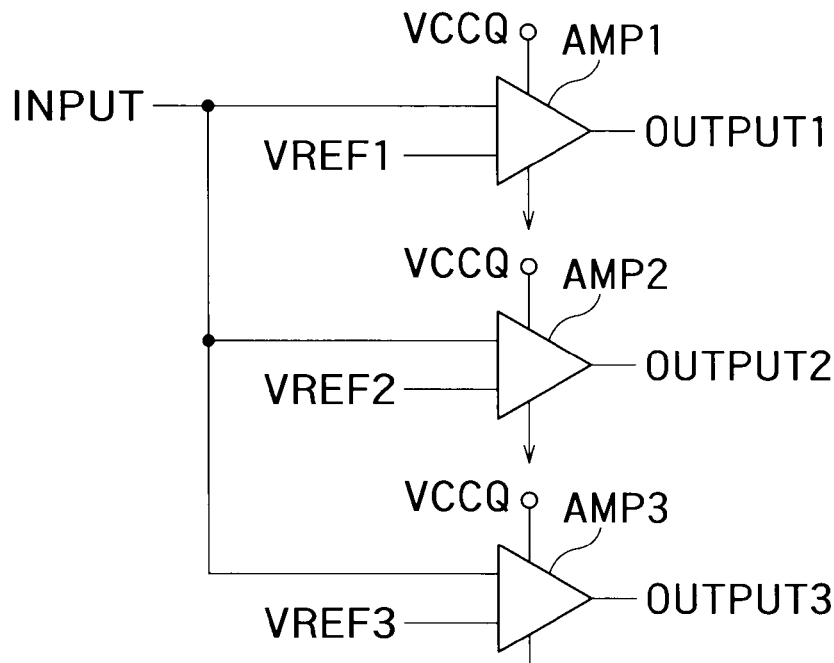
FIG. 7 shows an example of a configuration of an input buffer in the input/output buffer 5.

FIG. 7 shows an example of a configuration of an input buffer. The input buffer includes current-mirror differential amplifiers AMP1 to AMP3. One input of each of the current-mirror differential amplifiers AMP1 to AMP3 receives input data INPUT, and the other input of each of the current-mirror differential amplifiers AMP1 to AMP3 receives a corresponding one of reference voltage VRFF1 to VREF3, respectively.

Figure 8:
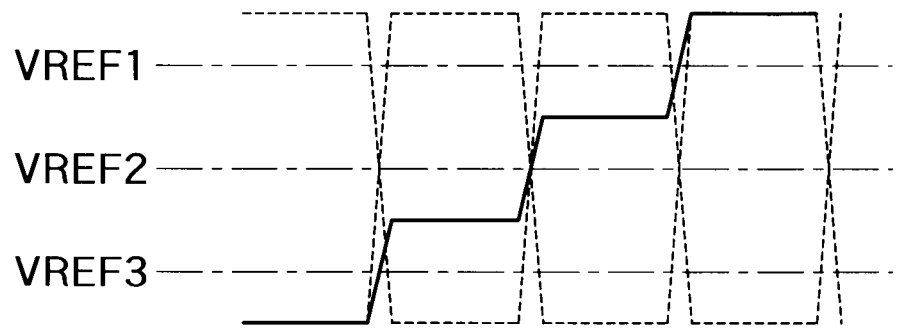
FIG. 8 shows a relationship among levels of the input signal INPUT to the current-mirror differential amplifiers AMP1 to AMP3 in the input buffer, outputs OUTPUT1 to OUTPUT3 of the input buffer, and UPPER/LOWER page input data.

FIG. 8 shows a relationship between levels of the input signal INPUT to the current-mirror differential amplifiers AMP1 to AMP3, and outputs OUTPUT1 to OUTPUT3, respectively. FIG. 8 also shows a relationship between UPPER data and LOWER data. The outputs OUTPUT1 to OUTPUT3 of the current-mirror differential amplifiers AMP1 to AMP3 are determined as shown in FIG. 8 corresponding to levels of the input data INPUT. Four patterns of each of the outputs OUTPUT1 to OUTPUT3 correspond to four-value data determining the UPPER data and the LOWER data, respectively. Although current-mirror differential amplifier type is used as input buffers in the first embodiment, inverter type can be also used.

Figure 9:
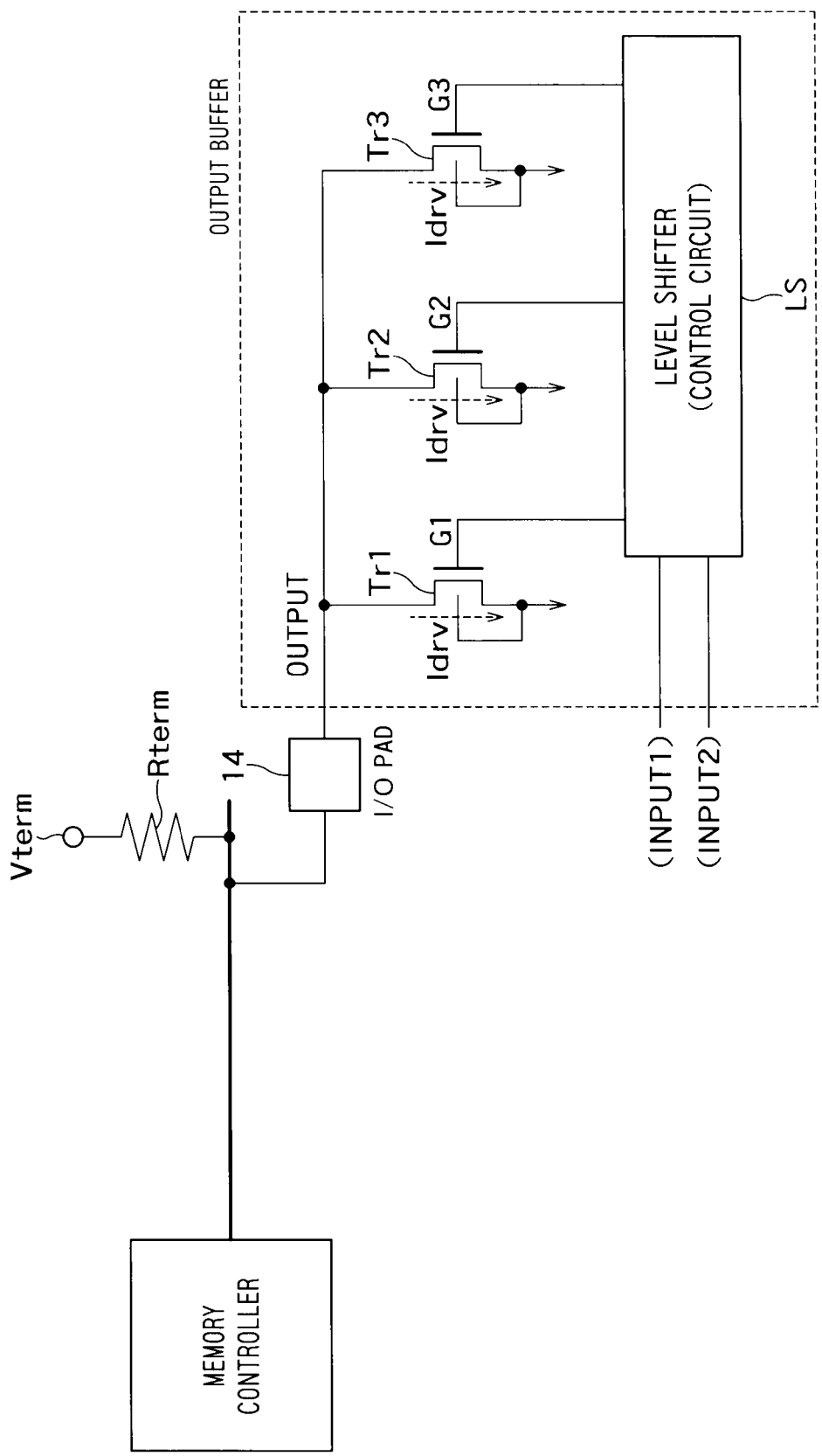
FIG. 9 shows an example of a configuration of an output buffer in the input/output buffer 5.

FIG. 9 shows an example of a configuration of an output buffer. The output buffer is an open-drain type output buffer. This output buffer includes transistors Tr1 to Tr3 connected between the input/output pad 14 and a reference voltage VSS, and a level shifter LS connected to gates G1 to G3 of the transistors Tr1 to Tr3.

The level shifter LS determines voltages of the gates G1 to G3 according to output data that is input, and determines the number of the gates G1 to G3 to be driven.

Figure 10:
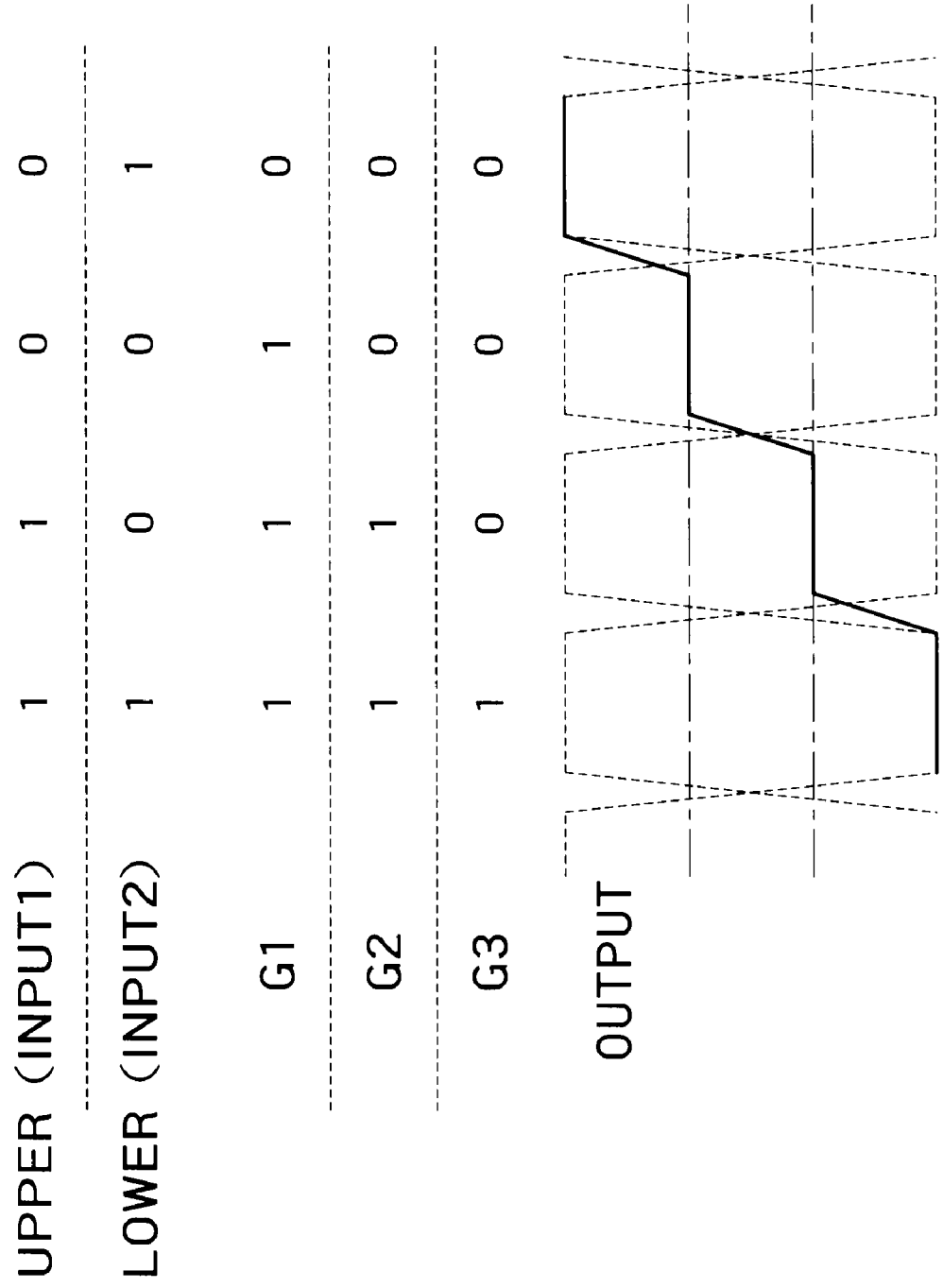
FIG. 10 shows a relationship among UPPER/LOWER page output data, levels of the gates G1 to G3 of a output buffer, and levels of output signal OUTPUT.

FIG. 10 shows a relationship between output data and levels of the gates G1 to G3, and a relationship with the output signal OUTPUT. The level shifter LS receives an UPPER page and a LOWER page of the output data as inputs INPUT1 and INPUT2, respectively, and drives the gates G1 to G3. For example, when the UPPER page and the LOWER page of the output data are (1, 1), voltages of the gates G1 to G3 become all logic high (1, 1, 1). In this case, the transistors Tr1 to Tr3 become all in an "on" state.

As shown in FIG. 9, an external bus is terminated to a potential Vterm via a terminal resistor Rterm. An voltage of the output signal OUTPUT from the input/output pad 14 is determined by the number of the transistors Tr1 to Tr3 that are in an "on" state. For example, when the transistors Tr1 to Tr3 are all in an "on" state, the voltage of the output signal OUTPUT from the input/output pad 14 becomes the lowest as shown in FIG. 10. Although the output buffer is an open-drain type output buffer in the first embodiment, a push-pull type output buffer can be also used.

FIG. 11 is a timing diagram showing data transfer at a data writing time. IOx indicates data input from the input/output pad 14. The input data IOx in this case indicates one of four values of input signal INPUT as shown in FIG. 8. IOin1 and IOin2 in FIG. 11 indicate data transferred from the data input/output buffer 5 to the input/output data latch circuit 15. IOin1 and IOin2 correspond to the LOWER page data and the UPPER page data shown in FIG. 8, respectively. DQb and DQt indicate transferred data from the input/output data latch circuit 15 to the data latch circuits DL. DQb is data transferred to the page buffer 13 at a lower side (a bottom side) of the memory cell arrays MCA0 and MCA1 shown in FIG. 6. DQt is data transferred to the page buffer 13 at an upper side (a top side) of the memory cell arrays MCA0 and MCA1 shown in FIG. 6.

Input data Di (i is an integer) is continuously input from the input/output pad 14 for each one clock of a write enable signal bWE. The input data Di is converted into LOWER data Di_L and UPPER data Di_U in the data input/output buffer 5, and the LOWER data Di_L and the UPPER data Di_U are simultaneously transferred to the input/output data latch circuit 15.

Out of the LOWER data Di_L and the UPPER data Di_U, data of i which is an even number is transferred to the data latch circuits DL (the page buffer 13) at the bottom side via DQb, and data of i which is an odd number is transferred to the data latch circuits DL (the page buffer 13) at the top side via DQt. The data Di_L and Di_U are alternately transferred to the data latch circuits at the top side and the data latch circuit at the bottom side. In this case, the LOWER data Di_L and the UPPER data Di_U having the same i are transferred in series in the data lines DQb and DQt. Therefore, data latched after being transferred to the flip-flops FF2 and FF4 via IOin2 are transferred to the data lines DQb and DQt with a delay of one cycle from data latched after being transferred to the flip-flops FF1 and FF3 via IOin1. Data at the bottom side and data at the top side are simultaneously transferred to the data latch circuits DL via the data lines DQb and DQt. Accordingly, data for two pages can be transferred to the data latch circuits DL at a high speed.

Data transferred to DQt is delayed by one clock cycle from data transferred to DQb. Therefore, in order to transfer all data from the input/output data latch circuit 15 to the data latch circuits DL, a last pulse of bWE shown by a broken line in FIG. 11 is necessary. The write enable signal bWE for this one clock can be input from outside of the chip, or can be automatically generated in the chip.

Figure 12:
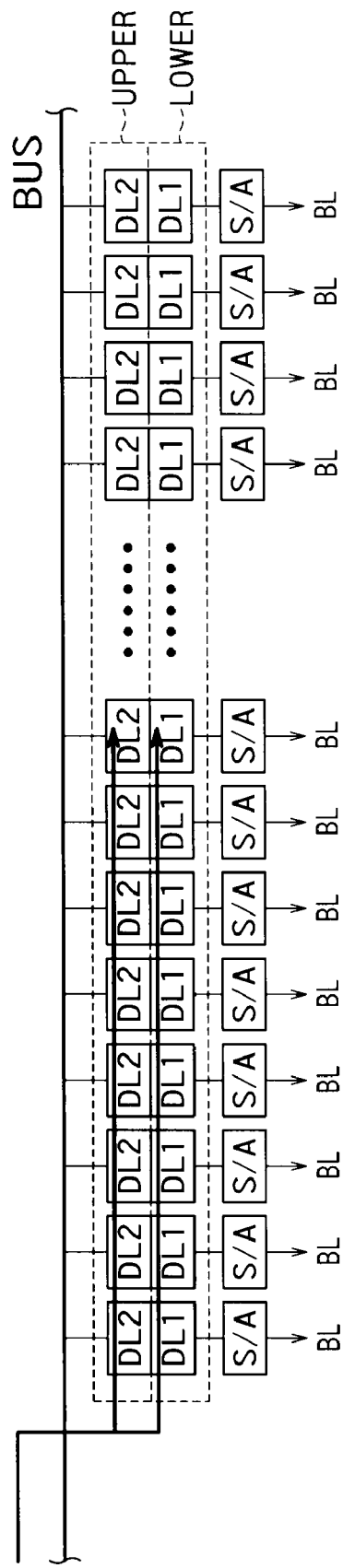
FIG. 12 is a conceptual diagram showing a flow of data transfer to the data latch circuits DL at a data writing time.

FIG. 12 is a conceptual diagram showing a flow of data transfer to the data latch circuits DL at a data writing time. One set of the data latch circuits DL is provided in each page buffer 13 at the bottom side and the top side, respectively.

UPPER data Di_U and LOWER data Di_L are transferred to the latch circuits DL1 and DL2 via a bus, as shown in FIG. 12. For example, D0_L, D0_U, D2_L, D2_U, . . . are transferred and stored in this order in the data latch circuit DL at the bottom side. D1_L, D1_U, D3_L, D3_U, . . . are transferred and stored in this order in the data latch circuit DL at the top side. By repeating this, data of multiple pages can be all transferred to the data latch circuits DL.

Figure 13:
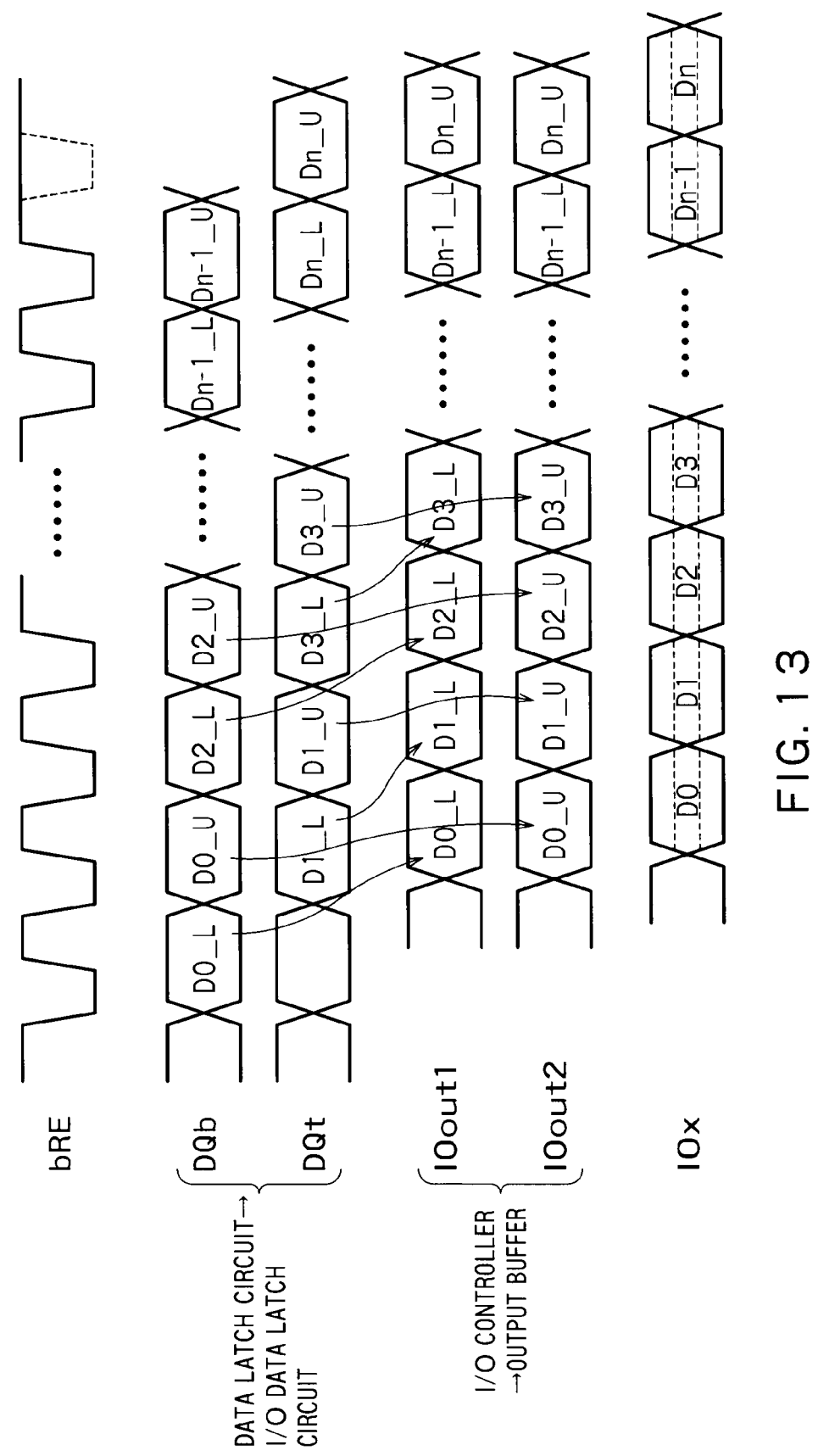
FIG. 13 is a timing diagram showing timings of data transfer from internal data buses to the input/output pad at a data reading time.

FIG. 13 is a timing diagram showing timings of data transfer from an internal data buses to the input/output pad at a data reading time. Data detected by the sense amplifiers S/A are latched by the data latch circuits DL. DQb and DQt indicate data transferred from the data latch circuits DL to the input/output data latch circuit 15. DQb indicates data transferred from the page buffer 13 at the bottom side, and DQt indicates data transferred from the page buffer 13 at the top side. IOout1 and IOout2 indicate data transferred from the input/output data latch circuit 15 to the data input/output buffer 5 or indicate IO output lines. IOout1 and IOout2 correspond to the LOWER data and the UPPER data, respectively shown in FIG. 10. IOx indicates data output from the input/output pad 14. The output signal OUTPUT in this case indicates a level of any one of the four levels as shown in FIG. 10.

The LOWER data Di_L and the UPPER data Di_U are transferred from the page buffer 13 to the input/output data latch circuit 15 via DQb and DQt at each one clock of the read enable signal bRE. The data Di_L and Di_U of the data latch circuit 13 at the bottom side, and the data Di_L and Di_U of the data latch circuit 13 at the top side are alternately transferred to the input/output data latch circuit 15. In this case, data transferred via DQt (the data latched by FF3 and FF4) are delayed by one cycle from the data transferred via DQb (the data latched by FF1 and FF2). That is, Di_L and Di−1_U, or Di_U and Di+1_L are transferred simultaneously. Data of Di_L is held for one clock longer in the flip-flops FF1 and FF2. With this arrangement, the LOWER data Di_L and the UPPER data Di_U having the same i can be transferred simultaneously via the IO output lines IOout1 and IOout2. As a result, data of two pages (2-bit data) can be read at a high speed as shown by IOx.

Data transferred to DQt is delayed by one clock from data transferred to DQb. Therefore, in order to transfer all data to the end from the data latch circuits DL to the input/output data latch circuit 15, the last pulse of bRE shown by the broken line in FIG. 13 is necessary. The read enable signal bRE for this one clock can be input from outside of the chip or can be generated in the chip.

Figure 14:
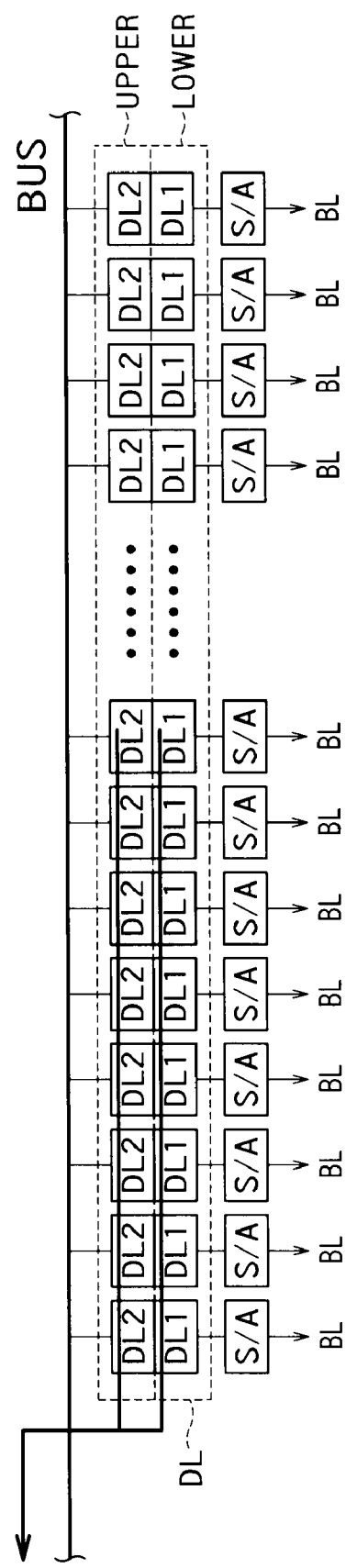
FIG. 14 is a conceptual diagram showing a flow of data transfer from the data latch circuits DL at a data reading time.

FIG. 14 is a conceptual diagram showing a flow of data transfer from the data latch circuits DL at a data reading time. The UPPER data Di_U and the LOWER data Di_L are detected by the sense amplifier S/A, and are stored in the data latch circuit DL. The data latch circuits DL can store data of all pages stored in a selected memory cell.

The UPPER data Di_U and the LOWER data Di_L are transferred to the input/output data latch circuit via buses. In this case, the data D0_L, D0_U, D2_L, D2_U, . . . are continuously transferred in this order from the data latch circuits DL at the bottom side to the input/output data latch circuit 15. The data D1_L, D1_U, D3_L, D3_U, . . . are continuously transferred in this order from the data latch circuits DL at the top side to the input/output data latch circuit 15.

According to the first embodiment, data of multiple pages corresponding to the number of bits that can be stored in a memory cell using the multi-level technique (two bits in this explanation) can be written or read in a one-time sequence.

Conventionally, in the flash memory using the multi-level technique, at the time of writing or reading data of multiple pages, data of each one page needs to be transferred separately. For example, when a memory cell stores 2-bit data, the UPPER data and the LOWER data need to be transferred individually.

On the other hand, according to the flash memory of the first embodiment, the input/output data latch circuit 15 and the input/output buffer 5 can transfer data of the same number of bits as the number of bits that can be stored in each of the memory cells M. The data latch circuit DL, the input/output data latch circuit 15, and the input/output buffer 5 can transfer data of two or more bits from the data latch circuit to outside in a sequence of one-time page reading.

With this arrangement, in the first embodiment, data of a necessary number of pages to perform high rate error correction with a strong ECC technique can be transferred in a one-time page reading sequence. Further, data of a necessary number of pages for a write operation can be transferred in a one-time page writing sequence. As a result, the flash memory according to the first embodiment can transfer data of multiple pages in a short time by using the multi-level interface technique.

There can be considered an alternative such that a cycle time of data transfer is increased using a high-speed interface. However, in this alternative case, a transistor having a low threshold value and high current-driving capability in an input/output buffer, an input/output data latch circuit, and a peripheral logic circuit need to be prepared. This results in higher cost. The high-speed interface needs to suppress noise such as a reflection in a external transmission data bus, in order to ensure data transfer. For this purpose, an input impedance and an output impedance need to be matched with that of a transmission data bus, and an output through rate needs to be controlled. Therefore, data transfer using the high-speed interface requires a more complex control than that of the first embodiment, and it results in higher cost.

Second Embodiment

Figure 15:
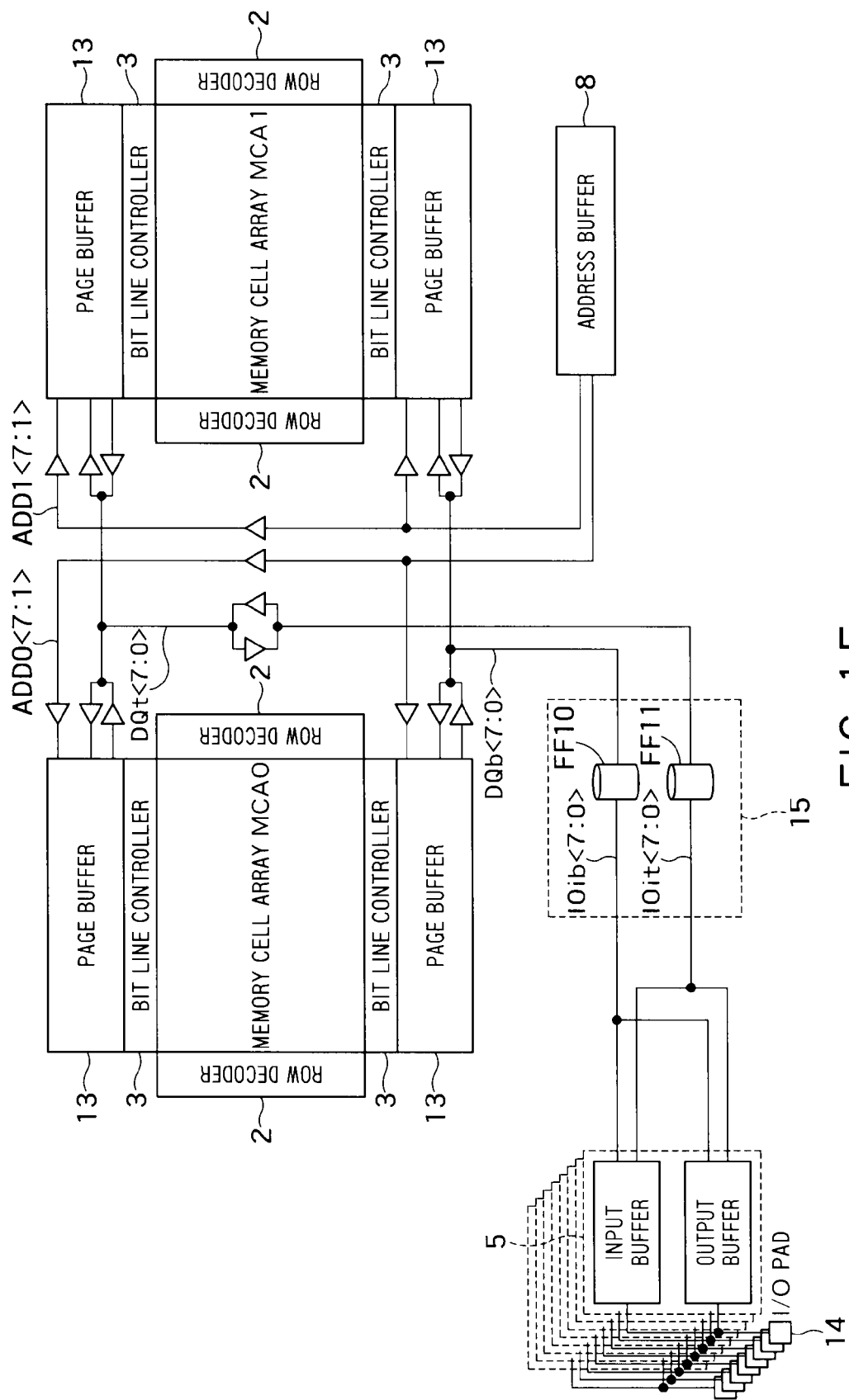
FIG. 15 shows a configuration of the input/output data latch circuit 15 and a configuration of data transfer paths up to a page buffer in a flash memory according to a second embodiment of the present invention.

FIG. 15 shows a configuration of the input/output data latch circuit 15 of a flash memory according to a second embodiment of the present invention, and a connection relationship between peripheries. The input/output data latch circuit 15 is connected between the page buffer 13 and the data input/output buffer 5, and transfers data between the page buffer 13 and the data input/output buffer 5. In this example, data of 8-bit <7:0> is batch processed.

The input/output data latch circuit 15 includes flip-flops FF10 and FF11. Each of the flip-flops FF10 and FF11 latches 8-bit data, and keeps latching the data until when the next data is transferred. The flip-flops FF10 and FF11 are configured such that when the next data is transferred, the flip-flops FF10 and FF1 are updated by the transferred data, and latch the updated data. The flip-flop FF10 latches data from the page buffer 13 at the bottom side, or latches data to the page buffer 13 at the bottom side. The flip-flop FF11 latches data from the page buffer 13 at the top side, or latches data to the page buffer 13 at the top side. Other configurations of the second embodiment can be identical to those of the first embodiment. The second embodiment is explained below by also assuming n=2, that is, one memory cell M stores 2-bit data.

Figure 16:
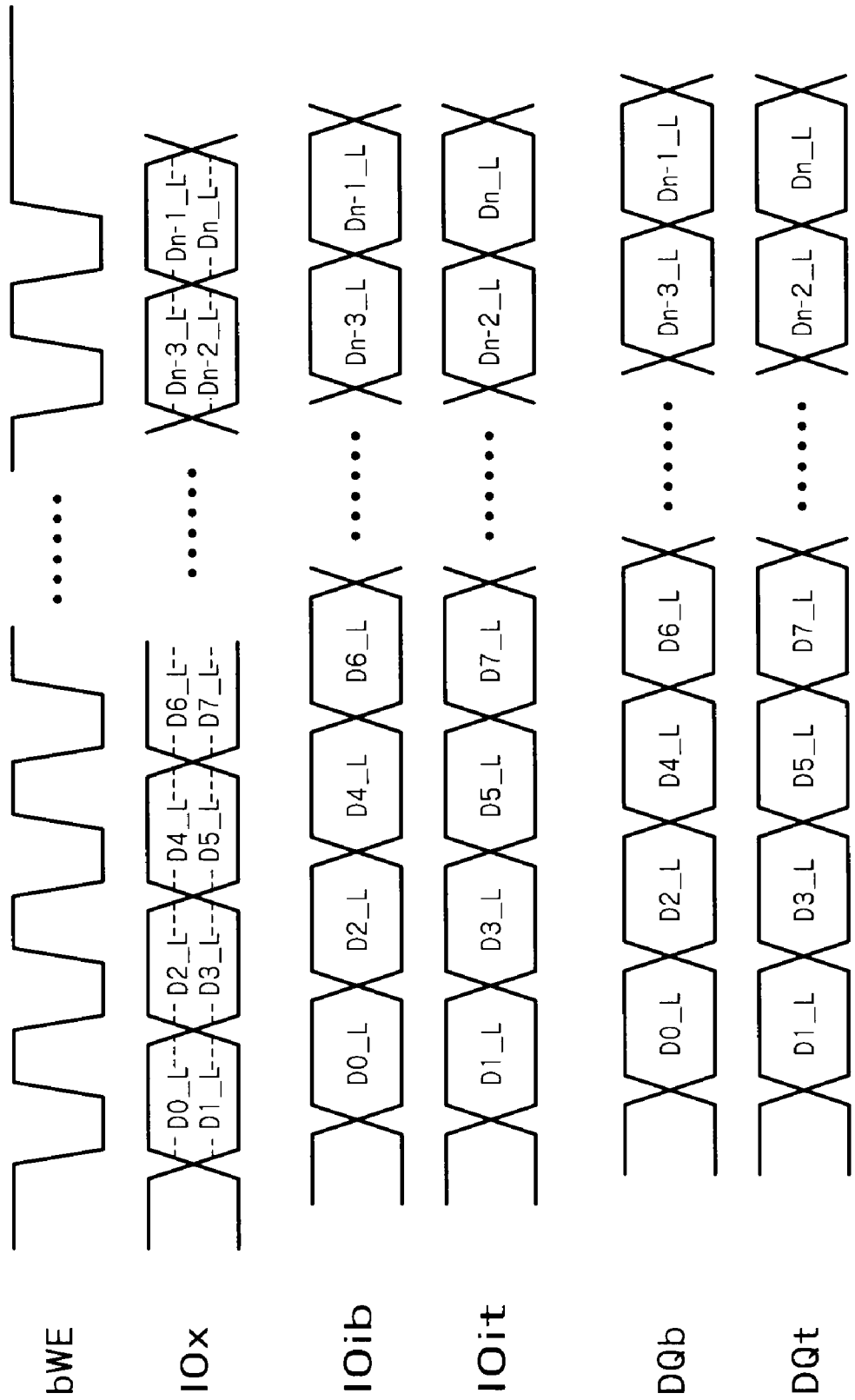
FIG. 16 is a timing diagram showing timings of data transfer from the input/output pad to internal data buses at a data writing time.

FIG. 16 is a timing diagram showing data transfer at a data writing time. In the second embodiment, the LOWER data Di_L and the UPPER data Di_U are transferred separately for each page. First, the LOWER data Di_L is continuously transferred in order. Next, the UPPER data Di_U is continuously transferred in order. Although FIG. 16 shows only a transfer of the LOWER data Di_L, the UPPER data Di_U is also transferred following the LOWER data Di_L in a similar way.

IOx input from the input/output pad 14 indicates a level of one of four levels at input signal INPUT as shown in FIG. 8.

Each data is 2-bit data including the LOWER data Di_L and Di+1_L stored in each of the buffer 13 at the bottom side and the buffer 13 at the top side, respectively. An input buffer converts input data INPUT into 2-bit data, and transfers the converted data to the input/output data latch circuit 15. However, in the second embodiment, the UPPER data and the LOWER data shown in FIG. 8 correspond to the LOWER data Di_L and Di+1_L.

The LOWER data Di_L and Di+1_L are transferred to the flip-flops FF10 and FF11 via data lines IOib and IOit, respectively. In this case, for example, LOWER data D0_L and D1_L are transferred simultaneously in one cycle. In the next cycle, LOWER data D2_L and D3_L are transferred simultaneously in one cycle. As a result, LOWER data D0_L, D2_L, D4_L, . . . (i is an even number) are continuously transferred to the flip-flop FF10 as LOWER data for the bottom side page buffer 13. LOWER data D1_L, D3_L, D5_L, . . . (i is an odd number) are continuously transferred to the flip-flop FF11 as LOWER data for the top side page buffer 13.

The LOWER data D0_L, D2_L, D4_L, . . . are transferred to the page buffer 13 at the bottom side via the data line DQb in the order latched by the flip-flop FF10. The LOWER data D1_L, D3_L, D5_L, . . . are transferred to the page buffer 13 at the top side via the data line DQt in the order latched by the flip-flop FF11. In this case, the LOWER data D0_L and D1_L are transferred simultaneously in one cycle, and the LOWER data D2_L and D3_L are transferred simultaneously in one cycle in the next cycle, for example.

Figure 17:
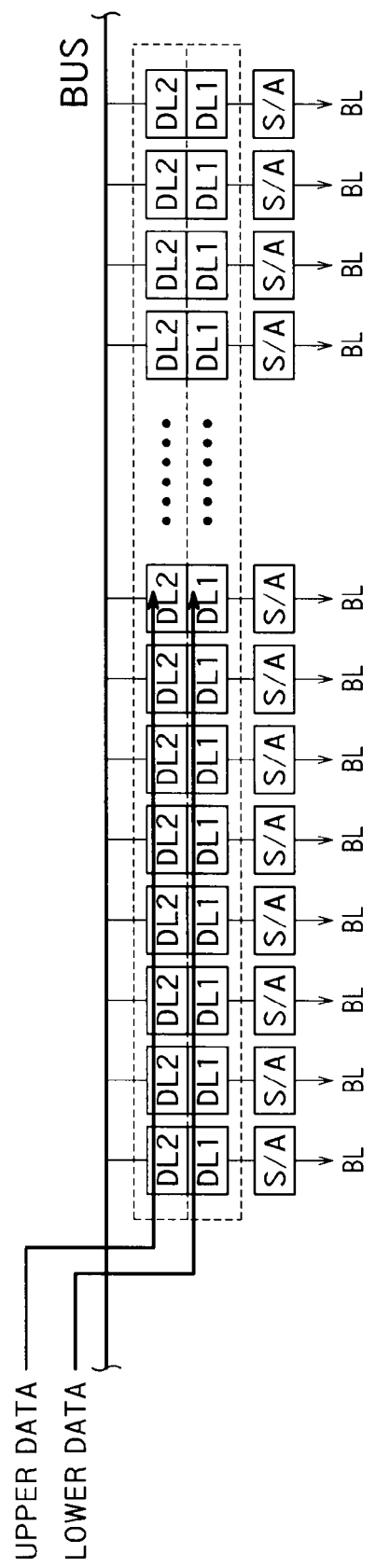
FIG. 17 is a conceptual diagram showing a flow of data transfer to the data latch circuits DL at a data writing time.

FIG. 17 is a conceptual diagram showing a flow of data transfer to the data latch circuits DL at a data writing time. Each one set of data latch circuits DL is provided in each of the page buffer 13 at the bottom side and the page buffer 13 at the top side.

The LOWER data D0_L, D2_L, D4_L, . . . are stored in a latch circuits DL1 via a bus, in the page buffer 13 at the bottom side. The LOWER data D1_L, D3_L, D5_L, . . . are stored in the latch circuits DL1 via the bus, in the page buffer 13 at the top side.

After all LOWER data are stored in the page buffer 13, UPPER data are input from the input/output pad 14. Although not shown in the drawing, the UPPER data are also transferred in a similar manner to data latch circuits D2. More specifically, UPPER data Di_U and Di+1_U are transferred to the flip-flops FF10 and FF11, via the data lines IOib and IOit respectively. In this case, for example, UPPER data D0_U and D1_U are transferred simultaneously in one cycle. In the next cycle, UPPER data D2_U and D3_U are transferred simultaneously in one cycle. As a result, UPPER data D0_U, D2_U, D4_U, . . . (i is an even number) are continuously transferred to the flip-flop FF10 as UPPER data at the bottom side. UPPER data D1_U, D3_U, D5_U, . . . (i is an odd number) are continuously transferred to the flip-flop FF11 as UPPER data at the top side.

The UPPER data D0_U, D2_U, D4_U, . . . are continuously transferred to the page buffer 13 at the bottom side via the data line DQb in the order latched by the flip-flop FF10. The UPPER data D1_U, D3_U, D5_U, . . . are continuously transferred to the page buffer 13 at the top side via the data line DQt in the order latched by the flip-flop FF11. In this case, the UPPER data D0_U and D1_U are transferred simultaneously in one cycle, and the UPPER data D2_U and D3_U are transferred simultaneously in one cycle in the next cycle, for example.

Thereafter, as shown in FIG. 17, the UPPER data D0_U, D2_U, D4_U, . . . are stored in a latch circuit DL2 via a bus, in the page buffer 13 at the bottom side. The UPPER data D1_U, D3_U, D5_U, . . . are stored in the latch circuit DL2 via the bus, in the page buffer 13 at the top side. In this way, the data are transferred for each page.

Figure 18:
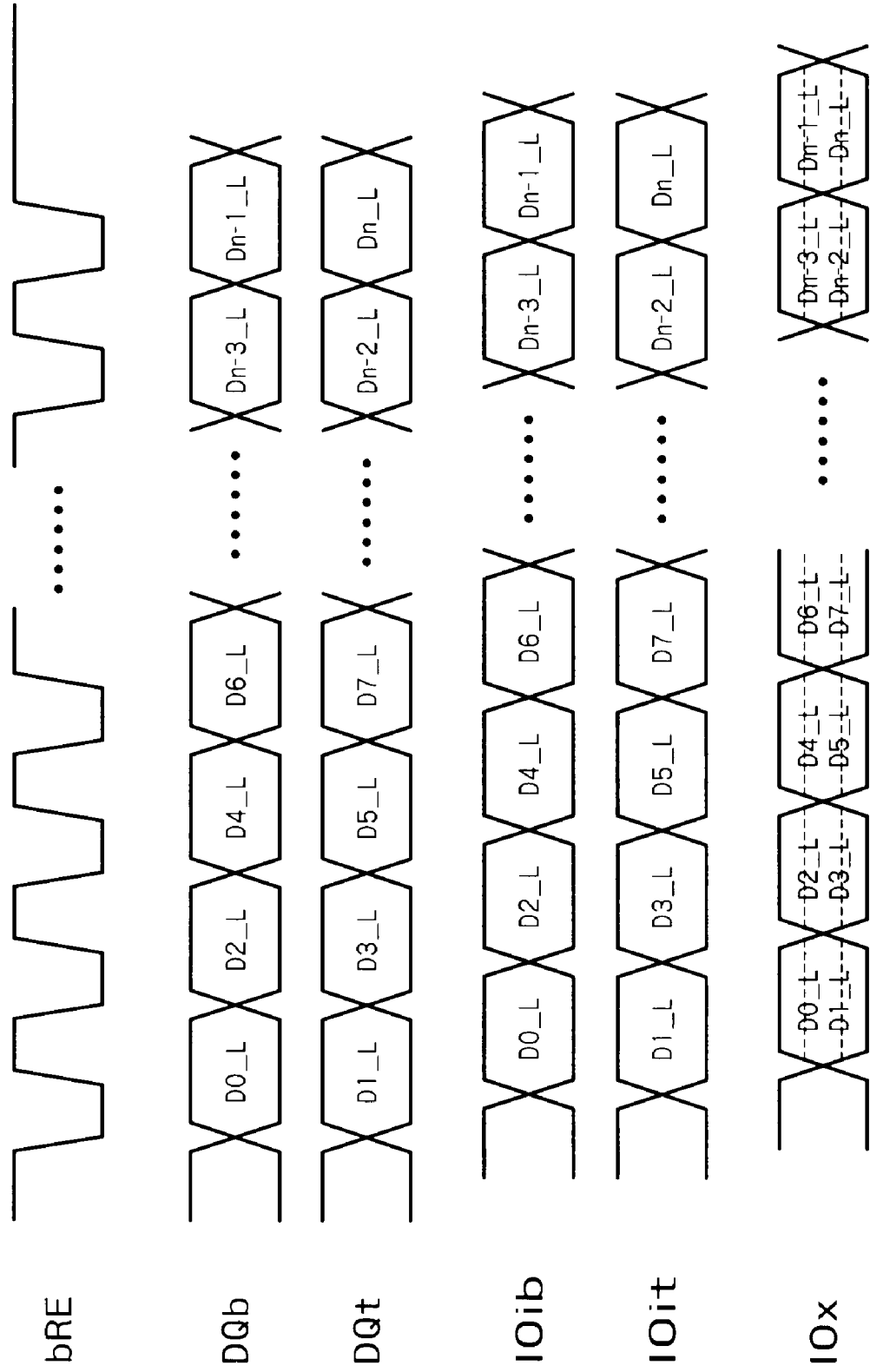
FIG. 18 is a timing diagram showing data transfer from internal buses to the input/output pad at a data reading time.
Figure 19:
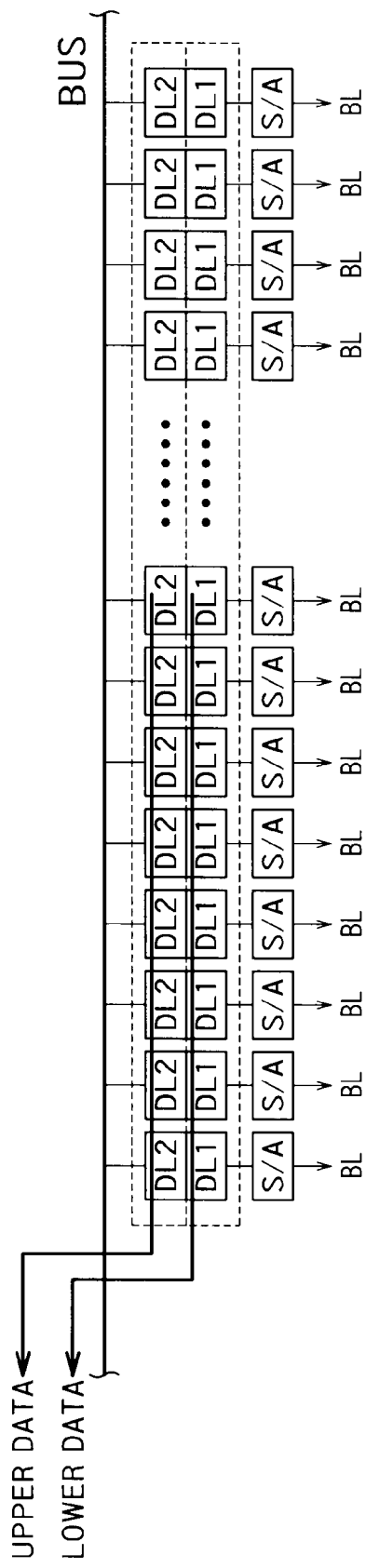
FIG. 19 is a conceptual diagram showing a flow of data transfer from the data latch circuits DL at a data reading time.

FIG. 18 is a timing diagram showing data transfer from an internal bus to the input/output pad at a data reading time. FIG. 19 is a conceptual diagram showing a flow of data transfer from the data latch circuit DL at a data reading time. Data detected by the sense amplifier S/A is latched by the data latch circuits DL. Only LOWER data are transferred from the latch circuits DL1 via a bus. The LOWER data D0_L, D2_L, D4_L, . . . are continuously transferred from the page buffer 13 at the bottom side to the flip-flop FF10 via the data line DQb. The LOWER data D1_L, D3_L, D5_L, . . . are continuously transferred from the page buffer 13 at the top side to the flip-flop FF11 via the data line DQt. In this case, the LOWER data Di_L at the bottom side and the LOWER data Di+1_L at the top side are transferred simultaneously in the same cycle. For example, the LOWER data D0_L and D1_L are transferred simultaneously in the one cycle. In the next cycle, the LOWER data D2_L and D3_L are transferred simultaneously.

The LOWER data are transferred to an output buffer via the data lines IOib and IOit in the order latched by the flip-flops FF10 and FF11. In this case, the LOWER data Di_L at the bottom side and the LOWER data Di+1_L at the top side are also transferred simultaneously in the same cycle. The output buffer converts 2-bit data including the LOWER data Di_L at the bottom side and the LOWER data Di+1_L at the top side into data showing a level of any one of the four levels shown in FIG. 10. However, the UPPER data and the LOWER data shown in FIG. 10 correspond to the LOWER data Di_L and Di+1_L.

An output signal having four-level from the output buffer are output from the input/output pad 14.

After the LOWER data (a LOWER page) are output, the UPPER data (an UPPER page) are transferred via a bus from the latch circuit DL2 shown in FIG. 19. The UPPER data D0_U, D2_U, D4_U, . . . are continuously transferred to the flip-flop FF10 via the data line DQb from the page buffer 13 at the bottom side. The UPPER data D1_U, D3_U, D5_U, . . . are continuously transferred to the flip-flop FF11 via the data line DQt from the page buffer 13 at the top side. In this case, the UPPER data Di_U at the bottom side and the UPPER data Di+1_U at the top side are transferred simultaneously in the same cycle.

The UPPER data are transferred to the output buffer via the data lines IOib and IOit in the order latched by the flip-flops FF10 and FF11. In this case, the UPPER data Di_U at the bottom side and the UPPER data Di+1_U at the top side are also transferred simultaneously in the same cycle. The output buffer converts 2-bit data including the UPPER data Di_U at the bottom side and the UPPER data Di+1_U at the top side into data indicating a level of any one of the four levels shown in FIG. 10. However, the UPPER data and the LOWER data shown in FIG. 10 correspond to the UPPER data Di_U and Di+1_U.

An output signal having four-levels from the output buffer are output from the input/output pad 14.

As explained above, in the second embodiment, although the LOWER data and the UPPER data are transferred separately for each page, 2-bit data can be transferred in one cycle. Although the data transfer method is different from that of the first embodiment, the second embodiment can achieve effects identical to those of the first embodiment.

Further, in the second embodiment, the input/output data latch circuit 15 is configured with only two flip-flop sets. Therefore, in the second embodiment, a circuit scale can be smaller than that in the first embodiment.

The four-level-cell technique of storing 2-bit data in the memory cell M has been explained in the first and second embodiments. However, needless to mention, these embodiments can be also easily applied to an eight-level-cell technique of storing 3-bit data in one memory cell or to a multi-value technique of storing more bits.

When one-memory cell is to store n-bit data, the input/output data latch circuit 15 and the input/output buffer 5 are configured to be able to transfer n-bit data. For example, in the first embodiment, when 3-bit data is to be transferred, the input/output data latch circuit 15 shown in FIG. 6 has three flip-flop sets provided corresponding to each of the bottom side and the top side. The multiplexers MUX1 to MUX4 select one of outputs from three flip-flops, and output the selected output. The current-mirror differential amplifiers shown in FIG. 7 are arranged by seven rows in parallel. With this arrangement, the input buffer can convert eight-level data into 3-bit data. The transistors shown in FIG. 9 are arranged by seven rows in parallel. With this arrangement, the output buffer can convert 3-bit data into eight-level data. For the data latch circuits DL shown in FIG. 12, three latch circuits DL1 to DL3 are provided for one column (one bit line BL). With this arrangement, the data latch circuits DL can store data of three pages at one time.

In the second embodiment, data (UPPER data and LOWER data) of each page of 2-bit data are transferred individually. In the second embodiment, as in the above case, when 3-bit data are to be transferred, 3-bit or 8-level data of UPPER, MIDDLE, and LOWER page are transferred separately.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the sprit of the inventions. The accompanying claims and their equivalents are intended to cover such forms or modifications as would fall within the scope and sprit of the invention.

The invention claimed is:

1. A flash memory comprising:
    a memory cell array comprising a plurality of memory cells, each of the memory cells storing n-bit data (n is an integer equal to or larger than 2);
    a plurality of word lines connected to gate terminals of the memory cells;
    a plurality of bit lines connected to the memory cells;
    sense amplifiers configured to detect data stored in the memory cells via the bit lines;
    a data latch circuit of m×n bits storing n-bit data stored in each of m memory cells (m is an integer equal to or larger than 2) connected to one of the word lines; and
    a multi-level interface capable of simultaneously transferring data of two or more bits between the data latch circuit and outside, wherein
    the multi-level interface receives an input signal having a level of any of $2^k$ levels (k is an integer equal to or larger than 2, and $k \leq n$), converts the input signal into k-bit data, and transfers the k-bit data to the data latch circuit, during a data writing operation.

2. The flash memory of claim 1, wherein the multi-level interface can simultaneously transfer the k-bit data (k is an integer equal to or larger than 2, and $k \leq n$).

3. The flash memory of claim 1, wherein the multi-level interface comprises:
- an input/output buffer configured to convert the k-bit data (k is an integer equal to or larger than 2, and k≦n) from the data latch circuit into a $2^k$ levels, or to convert a $2^k$ levels into k-bit data; and
- an input/output data latch circuit configured to temporarily hold data between the data latch circuit and the input/output buffer.

4. The flash memory of claim 1, wherein the multi-level interface receives the k-bit data (k is an integer equal to or larger than 2, and k≦n) from the data latch circuit, converts the k-bit data into an output signal having a level of any of $2^k$ levels, and outputs the output signal, during a data reading operation.

5. The flash memory of claim 1, wherein the data latch circuit comprises a first data latch circuit and a second data latch circuit provided corresponding to the memory cell array, and
- the multi-level interface alternately transfers 2-bit data to the first and the second data latch circuits during a data writing operation.

6. The flash memory of claim 5, wherein
- the multi-level interface alternately receives 2-bit data from the first and the second data latch circuits during a data reading operation.

7. The flash memory of claim 1, wherein when n-bit data of the m memory cells connected to one of the word lines is regarded as n data groups of n pages, each of data group including m data,
- the multi level interface transfers the n-bit data to the data latch circuit by transferring n data groups in serial during a data writing operation.

8. The flash memory of claim 1, wherein when n-bit data of the m memory cells connected to one of the word lines is regarded as n data groups of n pages, each of data group including m data,
- the multi-level interface receives the n-bit data from the data latch circuit by transferring n data groups in serial during a data reading operation.

9. The flash memory of claim 4, wherein when n-bit data of the m memory cells connected to one of the word lines is regarded as n data groups of n pages, each of data group including m data,
- the multi-level interface receives the n-bit data from the data latch circuit by transferring n data groups in serial during a data reading operation.

10. A driving method of a flash memory, the memory comprising: a memory cell array comprising a plurality of memory cells, each of the memory cells storing n-bit data (n is an integer equal to or larger than 2); a plurality of word lines connected to gate terminals of the memory cells; a plurality of bit lines connected to the memory cells; a data latch circuit of m×n bits; and a multi-level interface transferring data to the data latch circuit or receiving data from the data latch circuit, the method comprising:
- during data writing operation,
- receiving an input signal having a level of any of $2^k$ levels (k is an integer equal to or larger than 2, and k≦n) at the multi-level interface;
- converting the input signal into k-bit data by the multi-level interface, and transferring the k-bit data from the multi-level interface to the data latch circuit;
- storing m of the n-bit data (m is an integer equal to or larger than 2) in the data latch circuit, and transferring m of the n-bit data via m of the bit lines to m of the memory cells;
- storing m of the n-bit data in the m of the memory cells, respectively.

11. The method of claim 10 further comprising:
- during data reading operation,
- storing m of n-bit data transferred from m (m is an integer equal to or larger than 2) of the memory cells in the data latch circuit;
- receiving m of the k-bit data (k is an integer equal to or larger than 2, and k≦n) from the data latch circuit at the multi-level interface, converting the k-bit data to an output signal having a level of any of $2^k$ levels at the multi-level interface, and outputting the output signal having a level of any of $2^k$ levels from the multi-level interface.

12. A flash memory comprising:
- a memory cell array comprising a plurality of memory cells, each of the memory cells storing n-bit data (n is an integer equal to or larger than 2);
- a plurality of word lines connected to gate terminals of the memory cells;
- a plurality of bit lines connected to the memory cells;
- sense amplifiers configured to detect data stored in the memory cells via the bit lines;
- a data latch circuit of m×n bits storing n-bit data stored in each of m memory cells (m is an integer equal to or larger than 2) connected to one of the word lines; and
- a multi-level interface capable of simultaneously transferring data of two or more bits between the data latch circuit and outside, wherein
- the multi-level interface receives k-bit data (k is an integer equal to or larger than 2, and k≦n) from the data latch circuit, converts the k-bit data into an output signal having a level of any of $2^k$ levels, and outputs the output signal, during a data reading operation.

* * * * *